US008084751B2

(12) United States Patent
Freedman et al.

(10) Patent No.: US 8,084,751 B2
(45) Date of Patent: Dec. 27, 2011

(54) DETECTION ARRANGEMENTS IN MASS SPECTROMETERS

(75) Inventors: Philip Anthony Freedman, Wrexham (GB); Karla Newman, North Wales (GB)

(73) Assignee: Nu Instruments Limited, North Wales (GB)

( * ) Notice: Subject to any disclaimer, the term of this patent is extended or adjusted under 35 U.S.C. 154(b) by 195 days.

(21) Appl. No.: 12/656,549

(22) Filed: Feb. 3, 2010

(65) Prior Publication Data

US 2010/0193677 A1 Aug. 5, 2010

(30) Foreign Application Priority Data

Feb. 4, 2009 (GB) .................................. 0901840.9

(51) Int. Cl.
*H01J 37/244* (2006.01)
*H01J 49/26* (2006.01)
*H01J 49/06* (2006.01)

(52) U.S. Cl. ...... 250/397; 250/299; 250/281; 250/396 R

(58) Field of Classification Search .................. 250/397, 250/299, 281, 396 R
See application file for complete search history.

(56) References Cited

U.S. PATENT DOCUMENTS

| | | | | |
|---|---|---|---|---|
| 3,898,456 | A * | 8/1975 | Dietz | 250/299 |
| 5,202,562 | A | 4/1993 | Koga et al. | |
| 5,220,167 | A * | 6/1993 | Brown et al. | 250/281 |
| 5,426,299 | A | 6/1995 | Nakagawa et al. | |
| 5,463,219 | A | 10/1995 | Buckley et al. | |
| 6,091,068 | A | 7/2000 | Parfitt et al. | |
| 6,940,066 | B2 | 9/2005 | Makarov et al. | |
| 7,126,114 | B2 * | 10/2006 | Chernushevich | 250/287 |
| 2004/0119012 | A1 | 6/2004 | Vestal | |
| 2005/0194531 | A1 | 9/2005 | Chernushevich | |

FOREIGN PATENT DOCUMENTS

| | | | |
|---|---|---|---|
| DE | 3430984 | A1 | 3/1986 |
| EP | 1 215 711 | A2 | 6/2002 |
| GB | 2 421 841 | A | 7/2006 |
| GB | 2 446 005 | A | 7/2008 |
| JP | 11-213940 | | 6/1999 |
| WO | WO 98/50941 | A1 | 11/1998 |

* cited by examiner

*Primary Examiner* — Nikita Wells
(74) *Attorney, Agent, or Firm* — Breiner & Breiner, L.L.C.

(57) ABSTRACT

An approach to extending the dynamic range of the detector of a mass spectrometer is described. In one embodiment, in the case of high intensity beams, means are provided to deflect the ion beam, after the collector slit (1), on to an attenuator (4), which may be a grid or an array of small holes, through which only a small fraction of the ion beam reaches the ion detector (6). Use of an array of holes ensures that the recorded signal is insensitive to the distribution of ions within the beam. The beam passes directly to a detector if the signal is of low intensity.

11 Claims, 1 Drawing Sheet

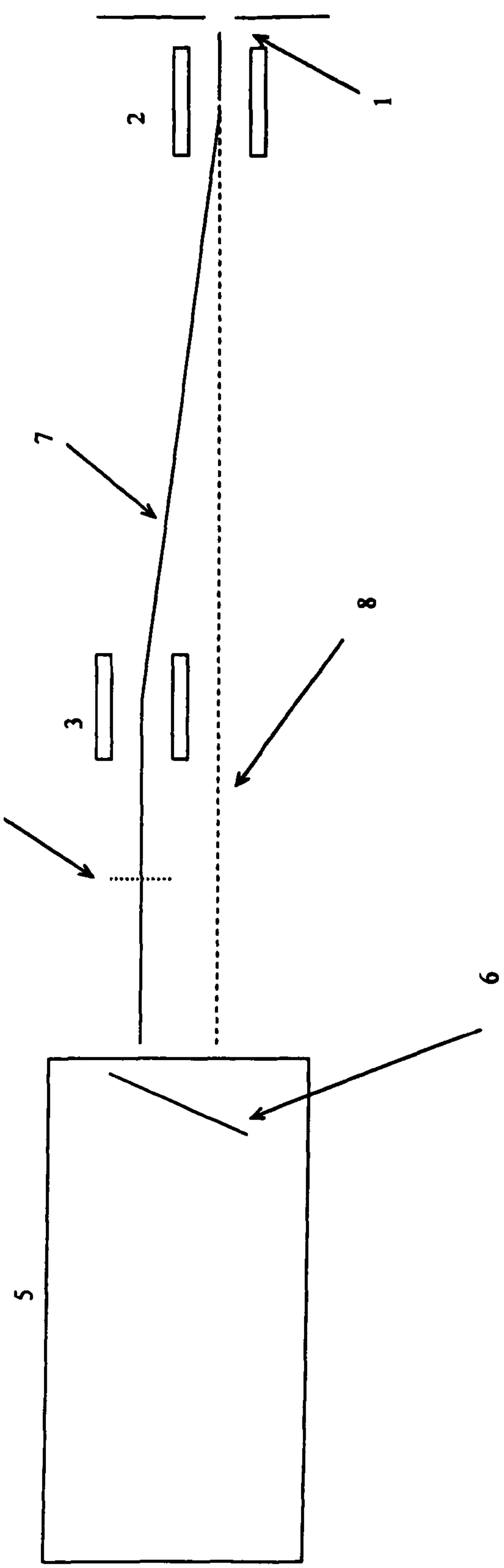
1
2
7
8
3
4
6
5

DETECTION ARRANGEMENTS IN MASS SPECTROMETERS

This invention relates to detection arrangements in mass spectrometers, and in particular to mass spectrometers which are required to operate satisfactorily over a wide dynamic range.

One of the major limitations with the use of electron multiplier detectors in mass spectrometers is their limited dynamic range when operated in an ion counting mode (also called pulse counting), and their lack of stability and noise when operated in an analogue detection mode.

When operated in an ion counting manner, the recorded multiplier signal passes through a discriminator, so that only pulses of a height greater than a certain pre-set value are recorded. This permits the electronic circuitry to reject most of the noise generated within the detection system itself, enabling very low signals to be recorded (typically less than 0.1 cps), but places a restriction on the total ion beam intensity that may be recorded. Since each recorded pulse has a finite width (typically 2 to 10 nanoseconds), if two events occur within this time, they are not recorded as individual counts. Although mathematical corrections for this problem exist, it effectively limits the maximum ion beam intensity which may be recorded, using the ion-counting mode of operation, to between 1 and $10\times10^6$ cps.

When operated in an analogue detection mode, the total amplified signal from the electron multiplier is recorded. Assuming the gain of the device is constant, and uniform, this permits the recorded signal to be equated (via the gain constant) to the incident ion beam intensity. Unfortunately this assumption is invalid. Since the gain at each stage of the amplification process is small (typically under 10), there is a large spread in this value due to Poisson statistics, resulting in this mode of operation being less precise than ion counting. This mode of operation suffers from two further disadvantages; it tends to be slower (due to the time response of the following electronics) and has a significant baseline noise, when compared to a multiplier system operated in the ion counting mode. However by operating the multiplier at a lower overall gain compared to one in ion counting mode, larger incident ion beam signal may be recorded. This mode of operation allows ion beams of up to about $10^9$ cps to be monitored.

For beams larger than this, it is possible to record the signal using a Faraday bucket type detector, with the collected ion beam current being converted to a voltage either via a large resistor (normally across a high impedance operational amplifier), or integrated on a small capacitor. This approach can be used for ion beam intensities of greater than about $10^5$ cps, provided sufficient integration time (approximately 1 second) is allowed to overcome the inherent noise of the detection system. However for a fast scanning mass spectrometer, where each event has to be recorded at time scales of under 1 millisecond, such a detector only produces a workable signal to noise level for beams above $10^9$ cps.

With conventional fast scanning mass spectrometers, it is usual to encounter ion beam signals from the very small (less than 1 cps), to very large (greater than $10^8$ cps) within one sample. It is therefore desirable to have a detector system that can accommodate this range of incident ion beam intensities. A number of approaches have been described previously.

One approach to the problem has been to use a dual mode detector. This approach is described in U.S. Pat. No. 5,463,219 and systems using this approach are commercially available. The detector incorporates a "gate" about half way up the multiplier chain which, when biased slightly negative with respect to its proceeding dynode, inhibits electrons from passing to the ion counting stage. A collector at this point is used as the input for the analogue detection electronics. Thus with input signals of less than about $10^6$ cps, the gate is open, and the ion counting mode is employed, whilst above this beam intensity the gate is closed and the analogue detection employed. As will be realised this approach automatically ensures that the analogue mode is operated at lower multiplier gain than the ion counting mode (since the gate is about half way up the multiplier chain), permitting the larger beams to be recorded without problems due to space charge from intense electron beams being observed. However these devices have not proved to be stable in practice and require constant re-calibration. Also, since very intense ion beams are incident on the first dynode of the multiplier, its lifetime is shortened considerably compared to devices that are not so maltreated.

An alternative approach is to limit the ion beam intensity before it impinges on the ion detector. This has the advantage of maintaining the fast ion counting mode of operation of the detector, whilst not shortening its life by degradation of the first dynode. EP-A-1215711 describes a system of this type whereby the ion beam incident on the entrance slit of a time of flight mass spectrometer can be defocused before this slit, thus reducing the number of ions passing into the mass spectrometer.

A further alternative approach is described in U.S. Pat. No. 5,426,299. In the spectrometer disclosed there, all the ions pass through the mass spectrometer. The detector is provided with a simple aperture in front of its throat, and a proportion of the ion beam deflected through this aperture using simple electrostatic deflectors. At small incident ion beam intensities, all the beam is deflected through the aperture, whilst only a small amount transmitted for larger intensity incident signals.

Both these approaches suffer from being very sensitive to the actual distribution of ions within the beam itself. As this spatial distribution within the ion beam profile changes, so does the proportion transmitted to the detector by the attenuating element (slit or hole). This is particularly severe in the field of inductive plasma mass spectrometry (ICPMS), where the ions of interest are only a small proportion of the total ion beam. Here the source comprises a high intensity argon plasma, to which the sample molecules are seeded. Energy is transferred from the argon ions to the sample, resulting in the molecules being fragmented and ionised, giving rise to a simple atomic mass spectrum, permitting the elemental and isotopic composition of the sample to be determined. This large ion beam intensity present (approximately 10 microamp in total) results in space charge distortions occurring within the beam profile. Further the large total ion beam causes "ion burns" to occur on the ion lenses and slits, which can further distort the ion beam profile due to charging. The degree of distortion can vary in time, if the focus conditions of the intense beam changes (as described in EP-A-1215711) or as the sample loading of the plasma varies. This can occur, for example, if standards are used to calibrate the mass spectrometer response, and the standard matrix composition does not exactly match that of the unknown sample (a highly unusual scenario). Such problems are encountered not only with solutions but are especially severe with laser sampling, where large variations of composition are often observed on the micro scale.

Such space charge problems are also encountered with other sources for the mass spectrometer, where the sample is entrained in a carrier.

We have now found that the dynamic range of a mass spectrometer may be materially enhanced in a manner which is minimally affected by the spatial distribution of the ion beam.

According generally to the present invention there is provided a mass spectrometer comprising a detection system including an ion multiplier detector means located at a distance from an ion beam defining slit from which a beam of ions emerges in a direction towards the ion multiplier, and wherein, located between the slit and the detector is a deflection means which when actuated may deflect the path of the beam from the slit to the detector into an alternative such path, and wherein an attenuator is located on one of the two paths.

When using such a spectrometer, the detection system including the ion multiplier can record the full ion beam which has passed through the final defining slit of the mass spectrometer, or record a small proportion of the beam which emerges from the attenuator. The attenuator preferably consists of a fine grid of holes in a suitable plate. The detection system may comprise a pair of detectors, where one is set to record the full ion beam which has passed through the final defining slit of the mass spectrometer, whilst the second records a small proportion of the beam. A single detector may be used to record both beams if the primary detection dynode is large enough.

The invention is further explained by way of the following description of an ICPMS constructed in accordance with the invention and the relevant parts of which are shown diagrammatically in the accompanying drawing.

Referring to the drawing, this shows in very simplified form the relevant parts of the ICPMS. The main components for producing a beam of ions are not shown, but can be thought of as lying to the right of the diagram. The ion beam to be subjected to analysis emerges via a conventional slit defining the beam size. This is denoted 1 in the diagram. As is customary, because it is not normal to measure the carrier ion beam intensity in ICPMS studies, the major carrier ion beam is rejected within the main mass spectrometer envelope, and is not passed through slit 1.

Ions in the beam emerging from slit 1 travel from right to left as shown in the diagram toward a standard ion multiplier detector 5 having a dynode 6 on to which the ions impinge.

In accordance with the invention, the ICPMS includes, between the slit 1 and the detector 5, a beam deflection arrangement consisting in the embodiment shown in the diagram of two deflectors, 2, 3. These may be of any suitable type. When these deflectors are actuated, the beam follows the path denoted 7, rather than the straight line path denoted 8 between slit 1 and the dynode 6.

Located between deflector 3 and the ion multiplier is an attenuator 4, which enables only a small fraction of the incident beam to pass through to dynode 6.

The ICPMS contains appropriate components to detect the intensity of the ion beam and in accordance with preset criteria to actuate or leave unactuated the beam deflectors 2, 3. In a typical operation, this may be arranged so that with ion beams of $10^6$ cps or less, the beam passes directly to the dynode 6 of the ion multiplier 5 along path 8, but with more intense ion beams, the beam is deflected to follow path 7 by the two deflectors 2, 3.

The attenuator 4 preferably consists of an apertured plate having a large number of holes in it distributed over the expected area of the ion beam, so as to ensure the entire ion beam profile is sampled. In a preferred embodiment an array of approximately 2.5 micron circular holes separated by 0.057 mm is used over an area of 6 mm square in a hard electroformed nickel plate of thickness around 25 microns. Each row is preferably offset by about 71.5° from its neighbour; this ensures that as the ion beam is swept across the grid as the magnet is scanned, effects similar to pixellation are minimised. The observed transmission of such an attenuator is about 1/800.

Other types of attenuator construction may be used if desired, and the degree of attenuation may be chosen to suit particular conditions.

The ion multiplier used may be selected from those commercially available. A preferred type is exemplified by Electron multiplier type AF144, available from ETP PTY Ltd, Ermington, NSW, Australia. This has a usable dynode area of 7 mm wide by 12 mm high. Used in ion counting mode it can operate satisfactorily over 9 orders of magnitude detection range (up to $2\times10^6$ cps without deflection, and to $10^9$ cps with deflection and attenuation).

In a preferred arrangement using such an attenuator and detector, the distance from the collector slit 1 to the attenuator 4 is approximately 100 mm. This ensures that the ion beam width at the attenuator is approximately 2 mm square, due to the natural divergence of the beam after it passes through the focussing slit. Since the whole ion beam is being sampled, variations in the spatial distribution of ions within the profile are accurately transmitted by the grid array. With a small number of holes, or a slit aperture, the observed transmission would be critically dependent on the spatial distribution of the beam. In the preferred embodiment, however, because of the array of small holes in the attenuator, the beam is being sampled in approximately 1300 places.

In practical implementation of the system diagrammatically shown in the accompanying drawing, both ion beams are also deflected out of the plane of the diagram (not shown) so as to ensure no photons are incident on the multiplier dynode, which would give rise to baseline noise on the recorded signal. This is well known in the prior art.

In place of the single detector shown in the drawing, two detectors may be used, permitting devices to be employed with smaller first dynode area. Also, the attenuator may be located on the straight line path from the slit 1, and the deflectors actuated when the beam intensity is low rather than high.

The invention claimed is:

1. A mass spectrometer comprising a detection system including an ion multiplier detector means located at a distance from an ion beam defining slit from which a beam of ions emerges in a direction towards the ion multiplier detector means; a deflection means, located between the slit and the detector means, which when actuated deflects the beam of ions from a first path from the slit to the detector means into a second path; and an attenuator which is located on one of the first path or the second path; wherein the attenuator includes an array of small holes in a plate thus ensuring that the recorded signal is insensitive to the distribution of ions within the beam.

2. A mass spectrometer according to claim 1, wherein the array has an overall area of 20 to 50 $mm^2$, and a transmission ratio of less than 1:100.

3. A mass spectrometer according to claim 2, wherein the transmission ratio is less than 1:1000.

4. A mass spectrometer according to claim 2, wherein the plate is of hard nickel and has a thickness of 20-50 microns.

5. A mass spectrometer according to claim 3, wherein the plate is of hard nickel and has a thickness of 20-50 microns.

6. A mass spectrometer according to claim 1, wherein the ion multiplier detector means includes two separate ion detectors, wherein one of said two ion detectors is located on the first path and one of said two ion detectors is located on said second path.

7. A mass spectrometer according to claim 1, wherein the ion multiplier detector means includes two separate ion detectors, wherein one of said two ion detectors is located on the first path and one of said two ion detectors is located on said second path.

8. A mass spectrometer according to claim 2, wherein the ion multiplier detector means includes two separate ion detectors, wherein one of said two ion detectors is located on the first path and one of said two ion detectors is located on said second path.

9. A mass spectrometer according to claim 3, wherein the ion multiplier detector means includes two separate ion detectors, wherein one of said two ion detectors is located on the first path and one of said two ion detectors is located on said second path.

10. A mass spectrometer according to claim 4, wherein the ion multiplier detector means includes two separate ion detectors, wherein one of said two ion detectors is located on the first path and one of said two ion detectors is located on said second path.

11. A mass spectrometer according to claim 5, wherein the ion multiplier detector means includes two separate ion detectors, wherein one of said two ion detectors is located on the first path and one of said two ion detectors is located on said second path.

* * * * *